United States Patent [19]

Matsumoto et al.

[11] Patent Number: 5,217,914
[45] Date of Patent: Jun. 8, 1993

[54] METHOD FOR MAKING SEMICONDUCTOR INTEGRATION CIRCUIT WITH STACKED CAPACITOR CELLS

[75] Inventors: Susumu Matsumoto; Toshiki Yabu, both of Hirakata; Yoshiro Nakata, Ikoma; Naoto Matsuo, Ibaraki; Shozo Okada, Kobe; Hiroyuki Sakai, Takatsuki, all of Japan

[73] Assignee: Matsushita Electric Industrial Co., Ltd., Osaka, Japan

[21] Appl. No.: 683,603

[22] Filed: Apr. 10, 1991

[30] Foreign Application Priority Data

Apr. 10, 1990 [JP] Japan .................... 2-095729

[51] Int. Cl.$^5$ .................... H01L 21/70; H01L 21/265
[52] U.S. Cl. ..................... 437/47; 437/52; 437/60; 437/919
[58] Field of Search .............. 437/47, 48, 52, 60, 437/919; 357/23.6, 51; 365/149

[56] References Cited

U.S. PATENT DOCUMENTS 4,742,018 5/1988 Kimura et al. .................... 437/48

FOREIGN PATENT DOCUMENTS

| | | | |
|---|---|---|---|
| 3929129 | 4/1990 | Fed. Rep. of Germany | 365/149 |
| 0098765 | 5/1987 | Japan | 357/23.6 |
| 1-74752 | 3/1989 | Japan | 437/919 |
| 0243573 | 9/1989 | Japan | 437/52 |
| 1-257365 | 10/1989 | Japan | |

OTHER PUBLICATIONS

"A New Stacked Capacitor Cell for 64M Bit DRAMS" ESSDERC 90, Notingham, Sep. 1990, Section 6 A 1, by C. S. Kim et al.
"Stacked Capacitor Cell Technology for 16M Bit DRAMS" ESSDERC 90, Notingham, Sep. 1990, Section 6 A 1, by C. S. Kim et al.
"Stacked Capacitor Cell Technology for 16M DRAM Using Double Self-aligned Contacts" ESSDERC 90, Notingham, Sep. 1990, Section 6 A 2, by M. Fukumoto et al.
A 1.28 $\mu m^2$ Bit-Line Shielded Memory Cell Technology for 64 Mb DRAM IEEE Symposium on VLSI Technology (1990) by Y. Kawamoto et al.

*Primary Examiner*—Olik Chaudhuri
*Assistant Examiner*—Loc Q. Trinh
*Attorney, Agent, or Firm*—Wenderoth, Lind & Ponack

[57] ABSTRACT

Disclosed is a semiconductor integrating circuit having stacked capacitor cells. Each of the cells includes an electric charge storage electrode for storing an electric charge, and a capacitor insulation film and opposite plate electrode integrated thereon. The electric charge storage electrode consists essentially of a bottom and a part in at least double frame-like portion or at least one column-like portion and at least one frame-like portion surrounding the column-like portion rising upwardly from the bottom surface. The capacitor deposited film consists of a dielectric material film deposited on all of the bottom plane and all surfaces of the charge storage electrode, and constructs a capacitor in cooperation with the opposite plate electrode. The described method for making a stacked capacitor cell can make it possible to form self-aligned capacitors by repeating a deposition of an oxide film and a conductive film and an anisotropic etching.

11 Claims, 19 Drawing Sheets

FIG. II

METHOD FOR MAKING SEMICONDUCTOR INTEGRATION CIRCUIT WITH STACKED CAPACITOR CELLS

BACKGROUND OF THE INVENTION

1. Field of Industrial Application

The present invention relates to a semiconductor integration circuit apparatus and a method for making the same and, more particularly, to stacked capacitor cells constructing a dynamic random access memory (hereinafter referred to as DRAM) and a method for making such cells.

2. Prior Art

FIG. 24 shows a cross-sectional view of a prior art stacked capacitor cell for forming a DRAM. In FIG. 24, a reference number 1 indicates a semiconductor substrate, 2 indicates a field oxide film, 3 indicates a source region, 4 indicates a drain region, 5 indicates a gate electrode and word line, 6 indicates a bit line, 7 indicates an inter-layer insulating film, 8 indicates an electric charge storage electrode, 9 indicates a capacitor insulation film, and 10 indicates a plate electrode. Furthermore, 13a indicates an upper insulating film and 15 indicates a side wall of an oxide film. The semiconductor substrate 1 is divided into a plurality of memory cells by the field oxide film 2. A MOS transistor for the memory cell comprises the source region 3, the drain gate 4, a gate oxide film 11a and the gate electrode 5 formed on the surface of the semiconductor substrate 1. The capacitor cell for the memory cell comprises the electric charge storage electrode 8, the capacitor insulation film 9 and the plate electrode 10. The electric charge is stored in the electric charge storage electrode 8. When a voltage is applied to the gate electrode 5, the MOS transistor turns on, and the electric charge stored in the electric charge storage electrode 8 flows to the bit line 6 through the source region 3 in order to write and/or read information.

According to the prior art stacked capacitor cell, as the DRAM becomes large in memory capacitance while each element constructing the DRAM is reduced in size, a problem arises that the decrease in area of the memory cell results in insufficient electric charge amount.

Further, various memory cells having three-dimensional structures have been proposed to increase the capacitance of the cell. However, the minimum scale of such a three-dimensional structure is limited to a resolution of the photolithography and, accordingly, it is difficult to realize a complex configuration by the photolithographic technique. In order to realize such a complex configuration, it becomes necessary to increase the height of the capacitor. However, in this case, the height difference between the memory cell portion and the circumferential circuit portion becomes large resulting in difficulty in patterning the wiring to be formed on said height difference, and breaking of the wiring.

SUMMARY OF THE INVENTION

The present invention has been developed with a view to substantially solving the above described disadvantages and has for its essential object to provide an improved semiconductor integration circuit having capacitor cells with a large capacitance capable of storing a large amount of electric charge with a small area, and also to provide a method for making such an improved semiconductor integration circuit irrespective of the minimum scale defined by the photolithographic resolution.

In order to achieve the object mentioned above, according to a first feature of the present invention there is provided a semiconductor integration circuit comprising stacked capacitor cells, each of which is formed partially in contact with a semiconductor substrate and has a stacked structure of an electric charge storage electrode, a capacitor deposited film and a plate electrode forming a counter electrode. The electric charge storage electrode consists of a base portion, and at least double frame-like wall portions rising upwardly from said base portion, respectively, and all outer surfaces of said electric charge storage electrode except for the lower surface thereof are covered with said capacitor is formed between said plate electrode and said electric charge storage electrode including said at least double frame-like wall portions.

According to a second feature of the present invention, there is provided a semiconductor integration circuit comprising stacked capacitor cells each of which is formed partially in contact with a semiconductor substrate and has a stacked structure of an electric charge storage electrode, a capacitor deposited film and a plate electrode forming a counter electrode. The electric charge storage electrode consists of a base portion, at least one column-like portion rising upwardly from said base portion, and at least one frame-like wall portion surrounding said at least one column-like portion. All outer surfaces of said electric charge storage electrode except for the lower surface thereof are covered with said capacitor deposited film and said plate electrode so that a capacitor is formed between said plate electrode and said electric charge storage electrode including said at least one column-like portion and at least one frame-like wall portion.

According to a third feature of the present invention, there is provided a manufacturing method for manufacturing the semiconductor integration circuit according to the first feature of the present invention, which comprises steps of forming an insulation film on a semiconductor substrate, making contact hole for each stacked capacitor cell in said insulation film which extends to the upper surface of said semiconductor substrates, forming a first conductive film on said insulation film and the inner surface of said contact hole, forming a first deposited film on said first conductive film in such a manner that the first deposited film has a shape having side wall portions, forming a second conductive film on said wall portions and the upper surface of said first deposited film and the surface of said first conductive film uncovered by said first deposited film, forming a second deposited film over all existing outer surfaces and, etching said second deposited film anisotropically to remove said second deposited film except for a portion thereof surrounding the side wall portions of said second conductive film, forming a third conductive film over all existing outer surfaces and, etching said second and third conductive films to remove portions of them other than the portions surrounding the side wall portions of said first and second deposited films to thereby form an electric charge storage electrode, removing said first and second deposited films, forming a capacitance deposited film on said electric charge storage electrode, and forming a plate electrode on said capacitance deposited film.

According to a fourth feature of the present invention, there is provided a manufacturing method for manufacturing a semiconductor integration circuit with stacked capacitor cells, comprising the steps of: forming an insulation film on a semiconductor substrate; making a contact hole for each stacked capacitor cell in said insulation film; forming a first conductive film on said insulation film and the inner surface of said contact hole; forming a first deposited film on said first conductive film; working said first deposited film to form a configuration having side wall portions; forming a second conductive film over all existing outer surfaces; etching said second conductive film anisotropically to remove it except for the portion surrounding said wall portions; forming a second deposited film over all existing outer surfaces; etching said second deposited film to remove it except for portions surrounding the side wall portions of said second conductive film; forming a third conductive film over all existing outer surfaces; etching said second and third conductive films to remove them except for portions surrounding said side wall portions of said first deposited film and to thereby form an electric charge storage electrode; removing said first and second deposited films; forming a capacitance deposited film on said electric charge storage electrode; and forming a plate electrode on said capacitance deposited film.

According to a fifth feature of the present invention, there is provided a manufacturing method for manufacturing the semiconductor integration circuit according to the third preferred embodiment, which comprises steps of forming an insulation film on a semiconductor substrate, making a contact hole for each stacked capacitor cell in said insulation film which extends to the upper surface of said semiconductor substrate, forming a first conductive film on said insulation film and the inner surface of said contact hole, forming a second conductive film on said first conductive film, working said second conductive film to form at least one column-like member, forming a first deposited film over all existing outer surfaces and etching said first deposited film anisotropically to remove it, except for the portion surrounding said at least one column-like member, forming a third conductive film over all existing outer surfaces, etching said second and third deposited films anisotropically to remove them except for portions surrounding side walls of said column-like member to form an electric charge storage electrode, removing said first deposited film, forming a capacitance film on said electric charge storage electrode, and forming a plate electrode on said capacitance deposited film.

In the first feature of the present invention, since the electric charge storage electrode has the double frame-like portions rising upwardly from the bottom portion thereof and the surfaces of the double frame-like portions are utilized for forming a capacitor, a surface area of the capacitor can be increased considerably and, accordingly, each capacitance cell can have a much greater capacitance while being the same size as a conventional capacitance cell.

According to the second feature of the present invention, the electric charge storage electrode has at least one column-like portion and at least one frame-like portion surrounding said at least one column-like portion, and all side walls of them contribute to form a capacitor.

Thus, there is provided a stacked capacitance cell having a capacitance larger than that of the prior art stacked capacitance cell while having a size which is the same as that of the stacked capacitance cell, according to the present invention.

Further, according to the third to fifth features of the present invention, stacked capacitance cells are easily made by repeating depositions of deposited and conductive films and anisotropic etching in a self-aligning manner.

BRIEF DESCRIPTION OF THE DRAWINGS

These and other objects and features of the present invention will become clear from the following description taken in conjunction with the preferred embodiments thereof with reference to the accompanying drawings, throughout which like parts are designated by like reference numerals, and in which:

FIG. 1($b$) is a cross-sectional view taken along line 1—1 in FIG. 1($a$);

FIG. 17($b$) is a cross-sectional taken along line 17—17 of FIG. 17($a$);

DETAILED DESCRIPTION OF THE PREFERRED EMBODIMENTS

First Preferred Embodiment

FIG. 1 shows a cross-sectional view of a stacked memory cell of DRAM constructing a semiconductor integration circuit according to the first preferred embodiment.

Figure 1A:
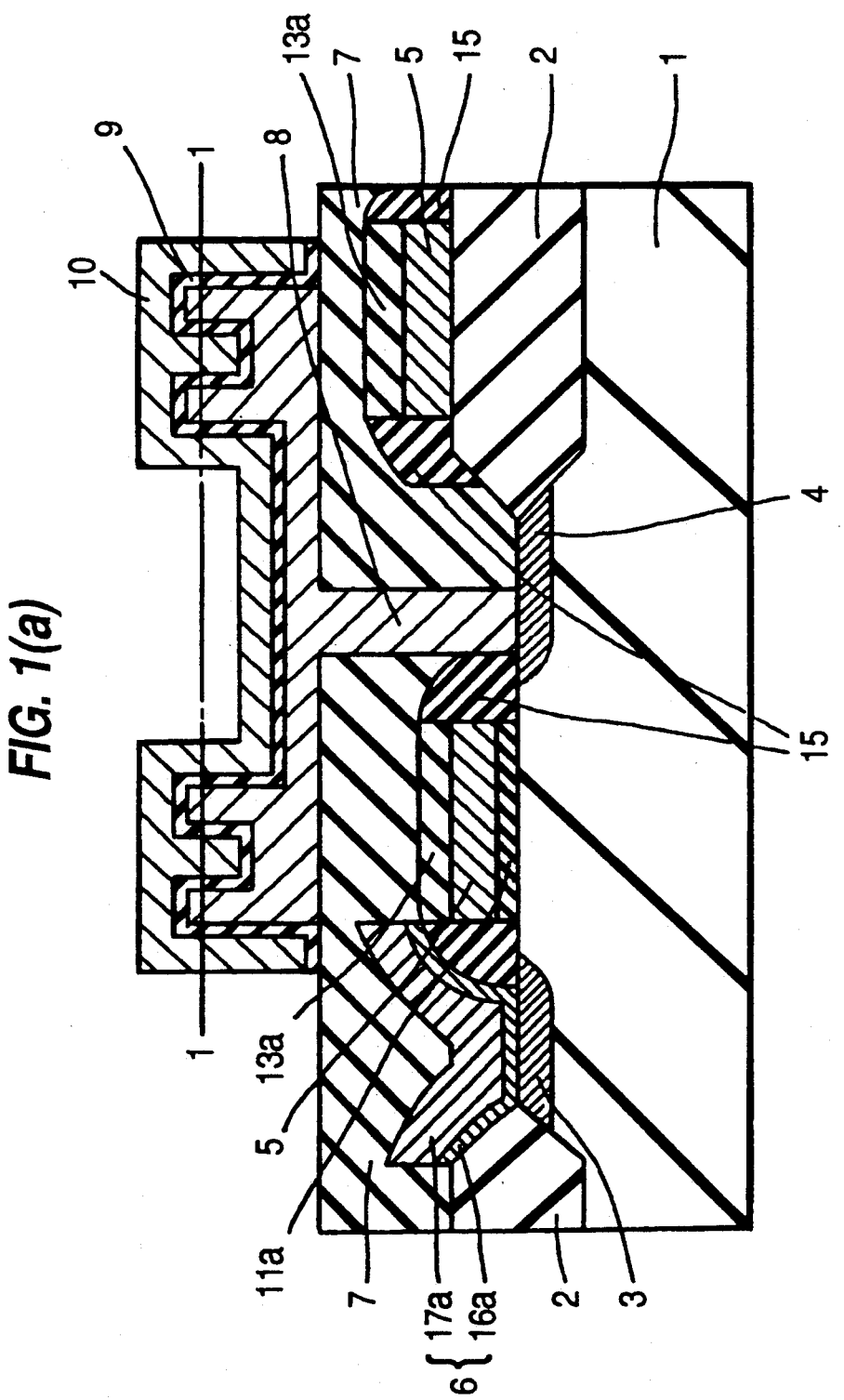
FIG. 1($a$) is a cross-sectional view of a memory cell of a semiconductor integration circuit according to the present invention.

Referring to FIG. 1(a), a MOS transistor for use in the memory cell comprises a source region 3, a drain region 4, a gate oxide film 11a and a gate electrode (or word line) 5 formed on a semiconductor substrate 1. A capacitor cell for use in the memory cell comprises an electric charge storage electrode 8, a capacitor insulating film 9 and a plate electrode 10 and stores the electric charge in the electric charge storage electrode 8. A bit line 6 is composed of a composite film made of a polycrystalline silicon film 16a and a silicide film 17a of a refractory metal. The DRAM further comprises a field oxide film 2, an inter-layer insulation film 7, an upper insulation film 13a and a side wall of oxide film 15.

Figure 1B:
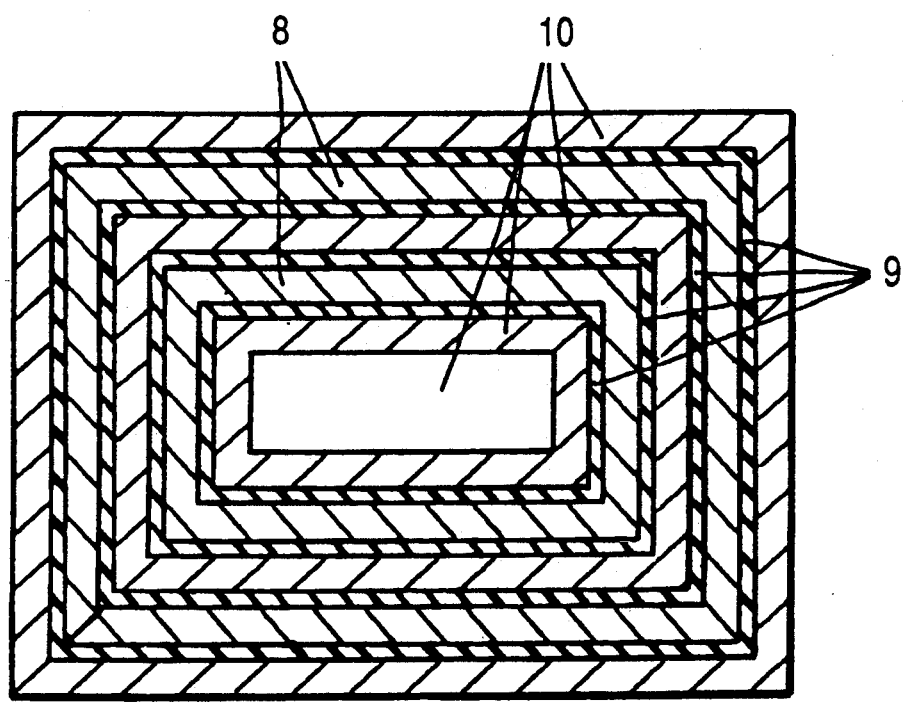

FIG. 1(b) is a cross-sectional view taken along line 1—1 in FIG. 1(a). According to the structure shown in FIGS. 1(a) and 1(b), the electric charge storage electrode 8 has a double frame-like portion positioned vertically relative to the bottom plane thereof. A capacitor is formed on the surface of the double frame portion and, accordingly, results in a large capacitance area. This structure permits a larger capacitance even when it is the same size as that of the prior art stacked capacitor cell.

Figure 2:
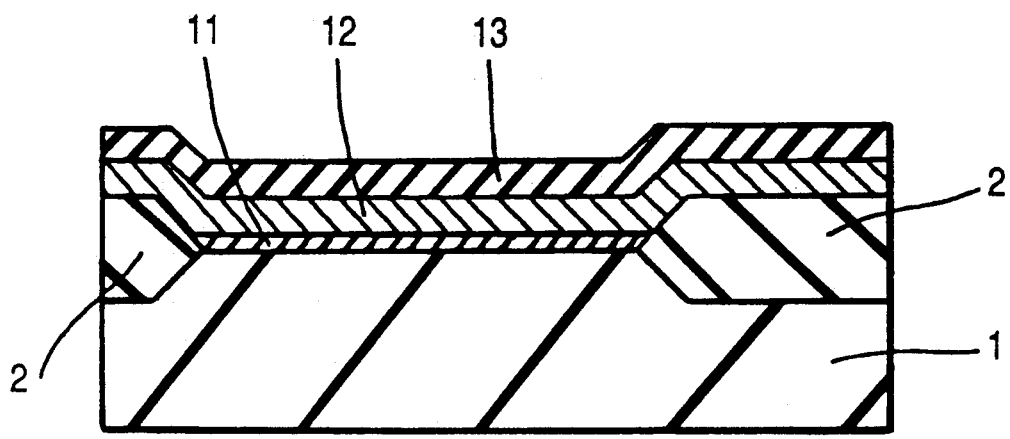
FIGS. 2, 3, 4, 5, 6, 7, 8, 9 and 10 are cross-sectional views showing individual steps for manufacturing the semiconductor integration circuit shown in FIGS. 1($a$) and 1($b$) according to the present invention.

The following description will explain a method for making a semiconductor integration circuit according to the first preferred embodiment of the present invention. Referring to FIG. 2, a P type silicon substrate 1 has a field oxide film 2 formed of the surface of a planar portion thereof by a LOCOS method. The field oxide film 2 is formed on an element separating region. A gate oxide film 11 is formed on the silicon surface by heating the silicon substrate 1. Then, the silicon substrate has a polycrystal silicon film 12 applied thereon for use in a gate electrode and a word line. A silicon dioxide ($SiO_2$) film is applied to the polycrystal silicon film 12 for use in an upper insulating film 13 by a CVD method.

Figure 3:
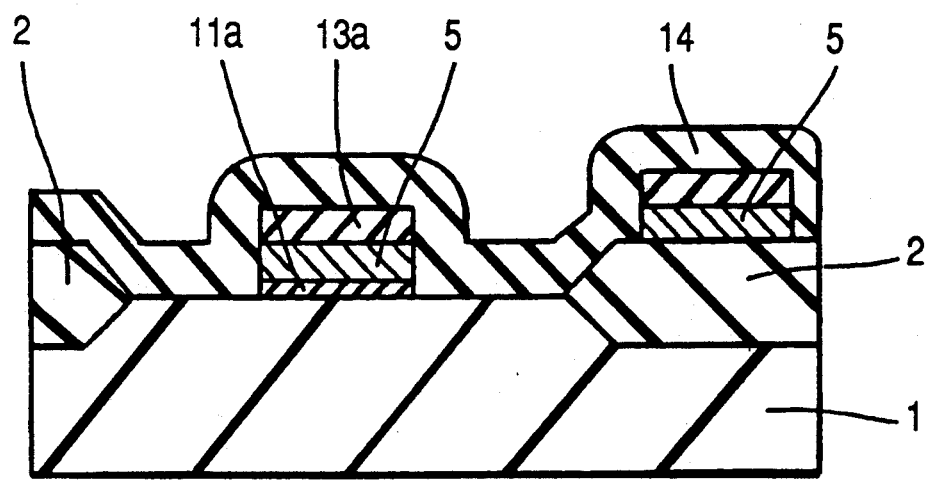
Figure 4:
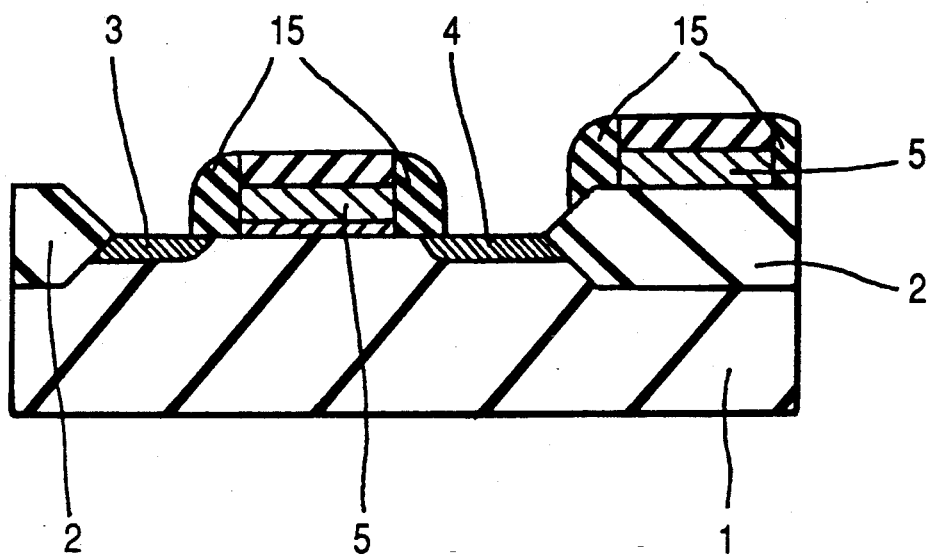

Referring to FIG. 3, the resultant silicon substrate 1 is subjected to a photolithographic process to form a pattern thereon and has a gate electrode and a word line 5 formed thereon by dry etching. The gate electrode and the word line 5 are formed on the same layer. In this embodiment, the gate electrode and the word line 5 are formed with a polycrystal silicon film including an N type impurity such as phosphorous or arsenic. In addition, the gate electrode and the word line may be composed of an element selected from the group consisting essentially of a refractory metal film, a silicide of a refractory metal film and a composite film having a refractory metal film or the silicide of refractory metal film deposited on a poly silicon film. Then, a silicon dioxide film 14 is applied over the entire resultant silicon substrate 1 by a CVD method. A side wall 15 is formed at the side wall of the gate electrode 5 by an anisotropic etching method as shown in FIG. 4. Thereafter, a source region 3 and a drain region 4 are formed by an ion implantation method.

Figure 5:
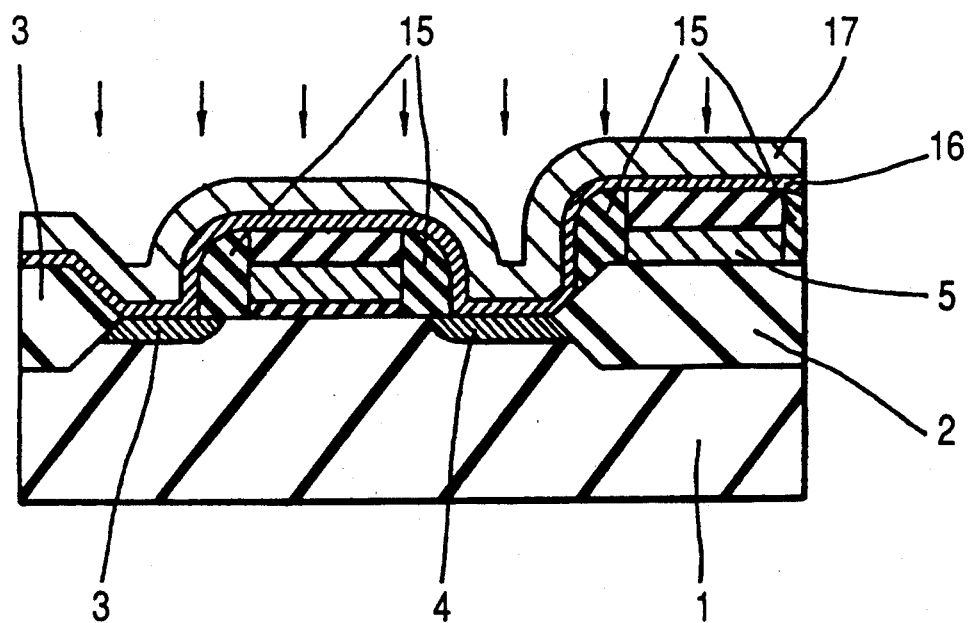
Figure 6:
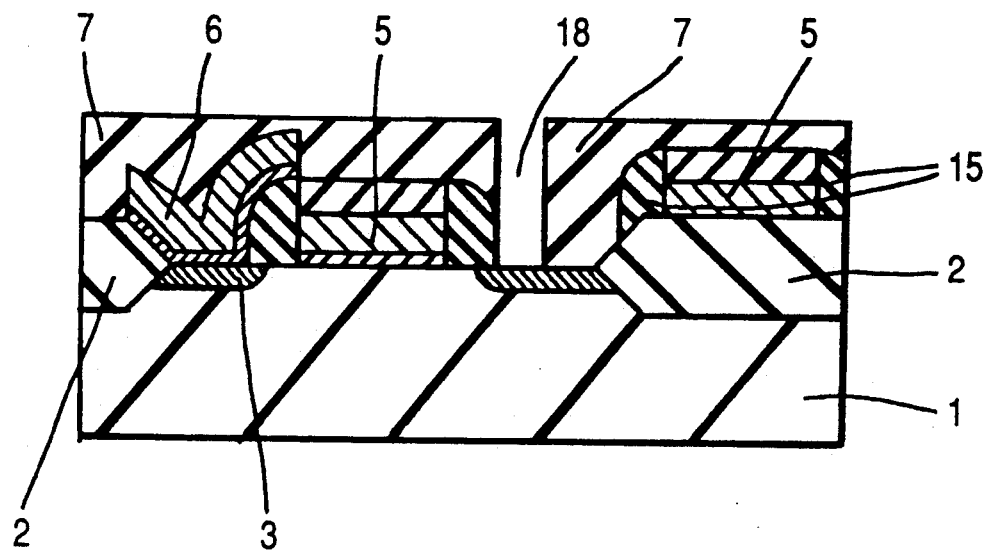

Next with reference to FIG. 5, a polycrystal silicon film 16 is applied to the side wall 15 by a CVD method and then an oxide film is removed by wet etching. After removal of the oxide film, a film in a polyside structure having a refractory metal silicide film 17 is deposited thereon. To decrease the electric resistance thereof, an N type impurity, such as arsenic or phosphorous, is added to the polycrystal silicon film 16 by an ion implantation or ion diffusion method. Then, a bit line 6 is formed by a photolithography method and dry etching method as shown in FIG. 6. The deposition of polycrystal silicon film 16 is executed for the purpose of decreasing the contact resistance of the source region 3 by the following steps. First, a chamber of a CVD apparatus is lowered to room temperature. The oxide film on the surface of source region 3 is removed by a wet etching method. After the removal of the oxide film, the silicon substrate 1 is put into the chamber and heated in a vacuum for the deposition of the polycrystal silicon film 16 (This CVD method is called a low temperature inserting CVD). The refractory metal silicide film 17 can be prepared by the low temperature inserting CVD method. The bit line 6 can be made of a polycrystal silicon film containing an N type impurity (phosphorous (P) or arsenic (As)), a refractory metal film, a refractory metal silicide film or an aluminum film. An inter-layer insulation film 7 is formed with a silicon dioxide film prepared by a CVD method (First step).

Figure 7:
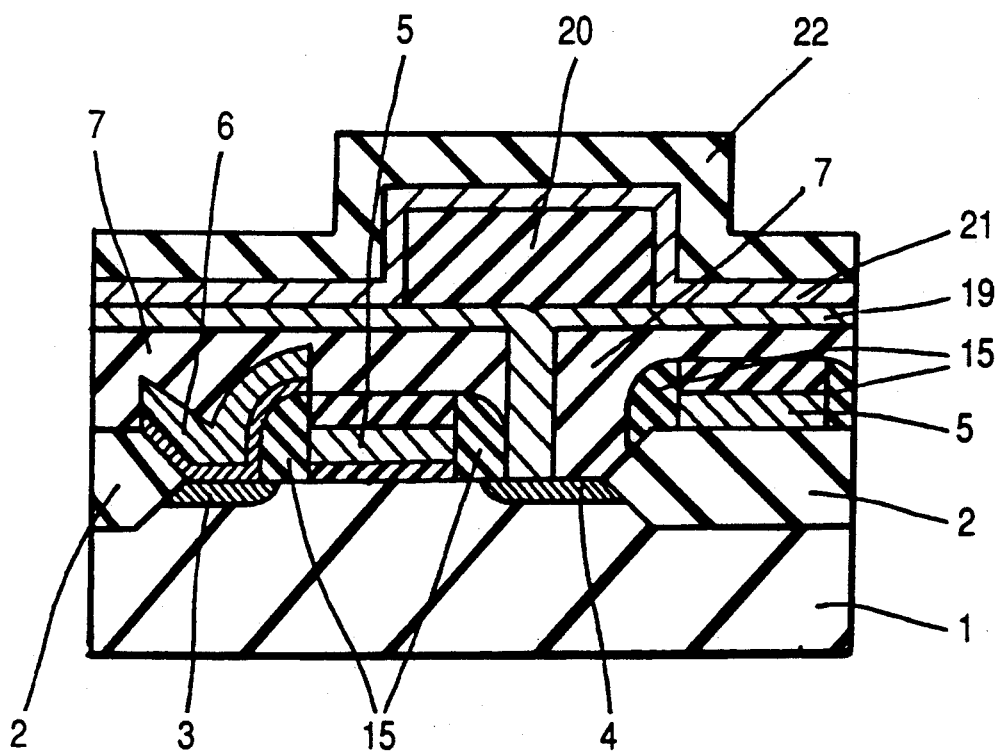
Figure 8:
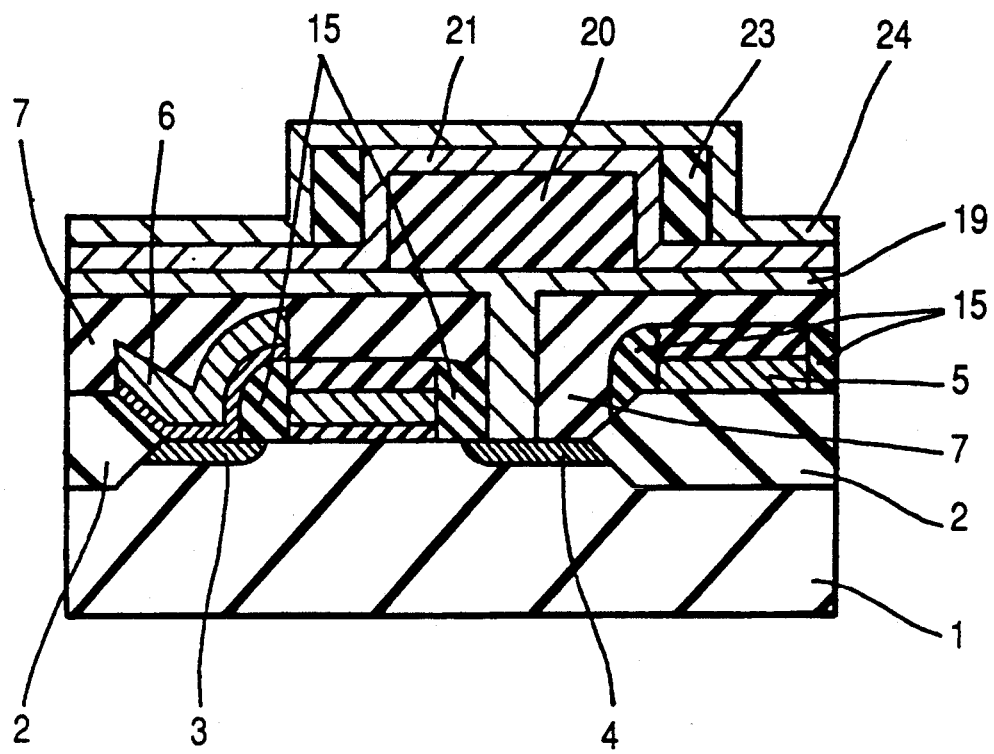

Next, to form an electric charge storage electrode 8, a contact hole 18 is made by a photolithographic method and a dry etching method. The contact hole 18 is filled with a polycrystal silicon film 19 including a several percent of phosphorous (P) prepared by the low temperature inserting CVD method as shown in FIG. 7. After the deposition of silicon dioxide film by the CVD method, a silicon dioxide film 20, for example, in a polygonal pillar is provided on a cell part by a photolithographic method and a dry etching method. The silicon dioxide film 20 can be in a column form. The silicon dioxide film 20 has a polycrystal silicon film 21 including several percent of phosphorous (P) deposited thereon by the low temperature inserting CVD method (Second step). Then a silicon dioxide film 22 is applied over the entire polycrystal silicon film 21 (Third step). The silicon dioxide film 22 is etch anisotropically to form side walls 23 as shown in FIG. 8 (Fourth step). After that, the silicon dioxide is coated with a polycrystal silicon film 24 including several percent of phosphorous (P) prepared with the low temperature inserting CVD method (Fifth step).

Figure 9:
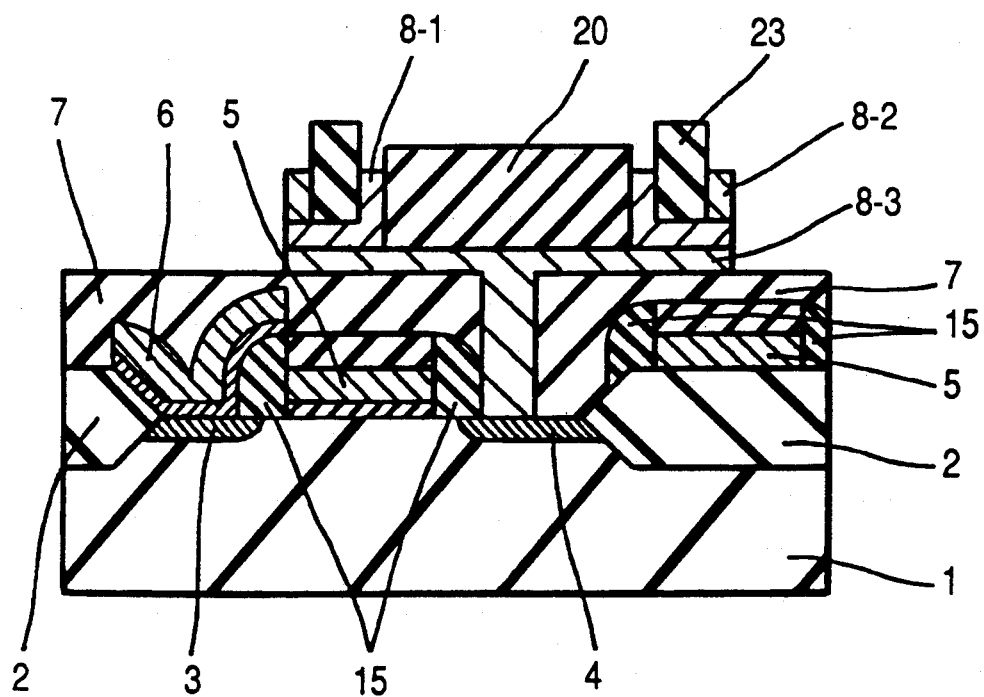

As shown in FIG. 9, by etching anisotropically the polycrystal silicon film 24, the polycrystal silicon film 21 and the base polycrystal silicon film 19 by a thickness equal to a sum of their thickness, two vertical side wall portions 8-1 and 8-2 and a bottom portion 8-3 of an electric charge storage electrode are formed, respectively (Sixth step). Before the anisotropic etching of the polycrystal silicon films 19, 21 and 24, the third step for deposition of the silicon dioxide film 22 to the fifth step for deposition of the polycrystal silicon film 24 can be repeated. The etching thickness at the sixth step for anisotropic etching can be made equal to the total thickness of the deposited polycrystal silicon films after the second step for depositing polycrystal silicon film 21 and the thickness of the polycrystal silicon film 19. The repetition of these steps results in side walls equal in number to the number of repetition cycles. Accordingly, the repetition permits an increase in the surface area of the electric charge storage electrode in the cell and results in an increase in the capacitance of the cell.

Figure 10:
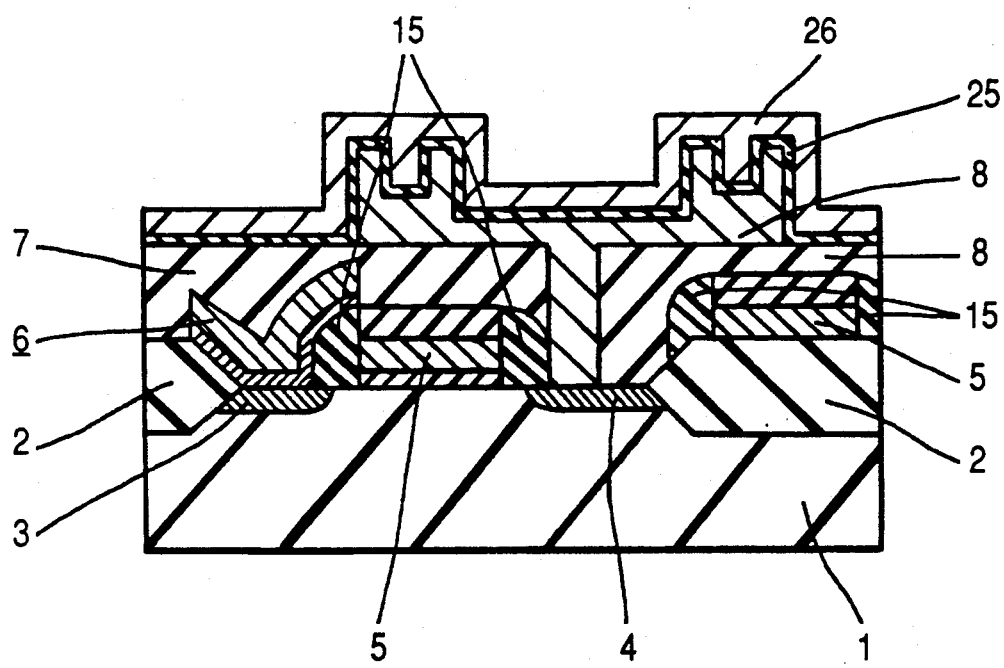

FIG. 10 shows a sectional view of a memory cell after removal of the silicon dioxide film 20 and the side wall 23 of the oxide film by any available method, for example, by a wet etching method after the sixth step. During the etching work, the inter-layer insulation film 7 is also etched.

Since the inter-layer film 7 is also etched at that time, it is necessary to select an easily etchable film such as a BPSG film formed by AP CVD method as the $SiO_2$ films 20 and 23. A further possible method is to deposit a silicon nitride (Si$_3$N$_4$) as an etching stopper after the inter-layer insulation film is deposited at the first step.

Thus, the electric charge storage electrode 8 is formed by the polycrystal silicon films 8-1, 8-2 and 8-3 having been formed by the foregoing steps.

Next, a capacitor insulation film 25 is formed and composed of a tri-layered film (ONO film) of silicon nitride (SI$_3$N$_4$) film prepared by a CVD method and the silicon dioxide film prepared by a thermal treatment including a natural oxidation on the surface of the electric charge storage electrode. Another possible way is to replace the single layer of silicon dioxide film with any other dielectric film such as a tantalum oxide film (Ta$_2$O$_5$) On the capacitor insulation film 25, a polycrystal silicon film 26 containing several percent of P is deposited.

As shown in FIG. 1(a), a pattern is formed by a photolithographic method, and the plate electrode 10 and the capacitor insulation film 9 are formed by a dry etching method. The plate electrode 10 can be composed of any other conductive film, such as a tungsten metal or a metal silicide, instead of the polycrystal silicon film.

Figure 14:
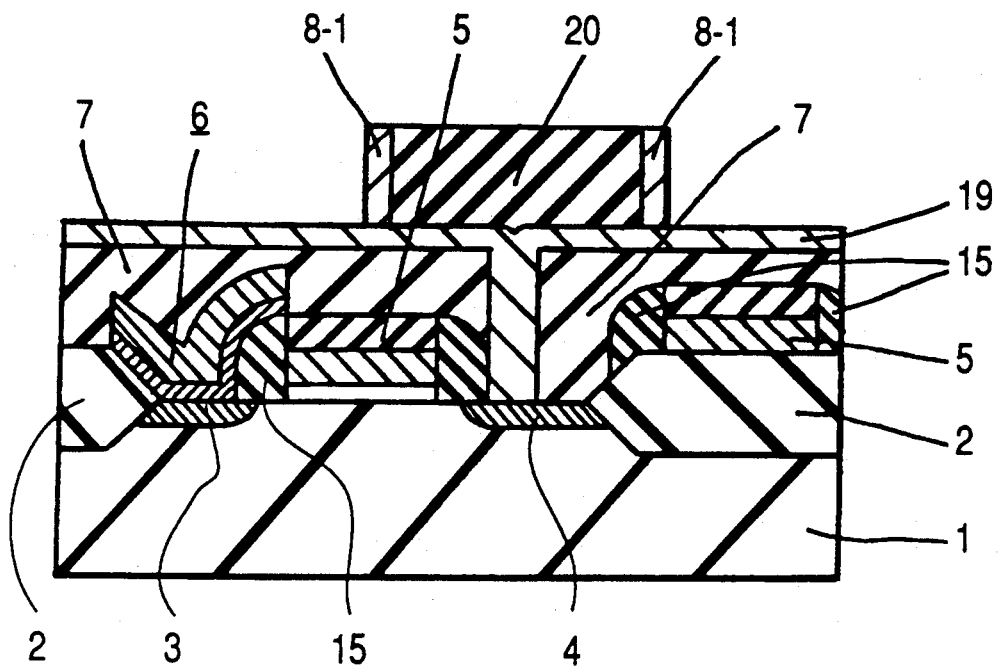
FIGS. 14, 15 and 16 are cross-sectional views showing variations of the manufacturing method according to the first preferred embodiment, respectively, of the present invention.
Figure 15:
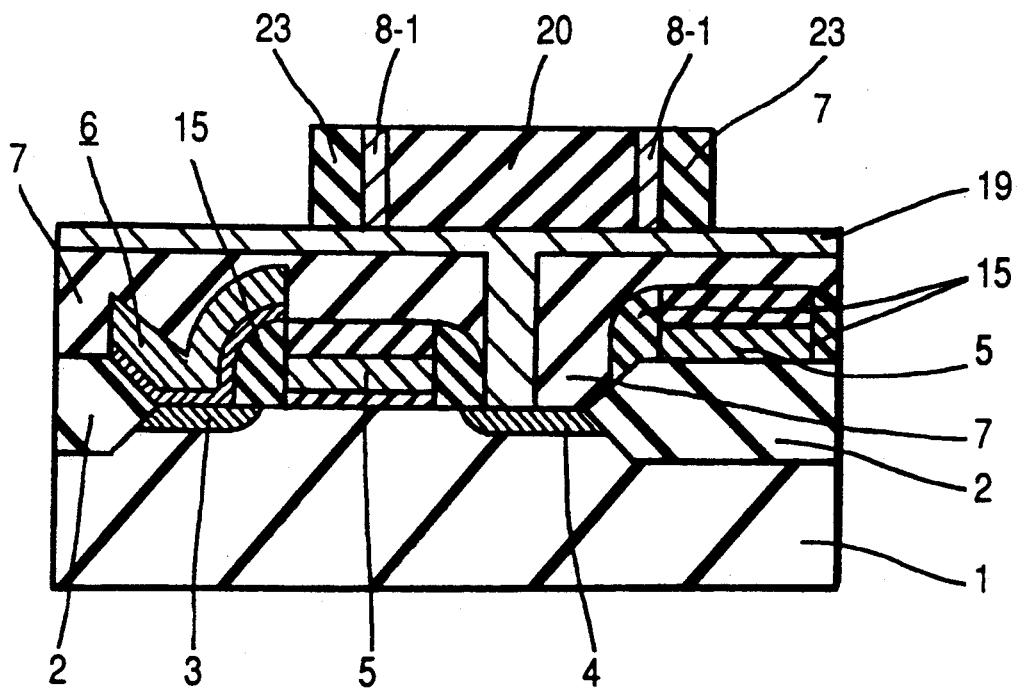
Figure 16:
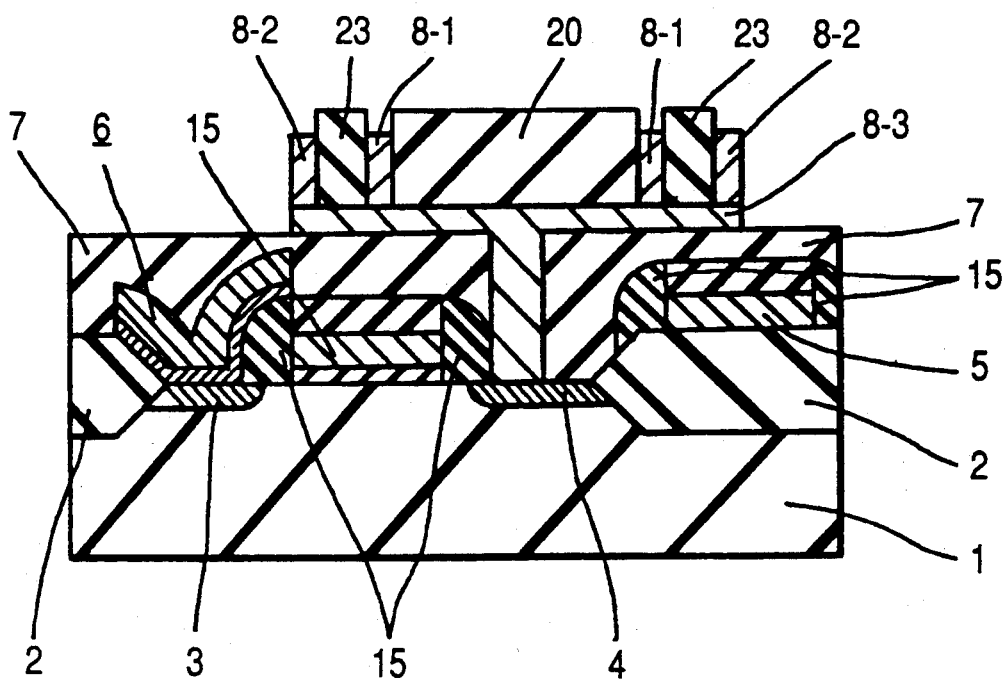

The following steps can be performed after the second step in place the third to the sixth steps. At first, as shown in FIG. 14, a side wall portion 8-1 of the charge storage electrode is formed by etching the poly-Si film 21 (formed in the second step) anisotropically by a thickness thereof (Seventh step). Next, as shown in FIG. 15, after depositing a SiO$_2$ film by a CVD method, a side wall 23 of the SiO$_2$ film is formed by an anisotropic etching (Eighth step). Thereafter, as shown in FIG. 16, another side wall portion 8-2 and a bottom portion 8-3 of the charge storage electrode are formed by etching a poly-Si film 24 (not shown) deposited just before and the poly-Si film 19 by a thickness equal to a sum of thicknesses of these two film 24 and 19 (Ninth step). It is possible to form many more side wall portions of the charge storage electrode by repeating the second, seventh and eighth steps before executing the ninth step.

Further, when the third to sixth steps are executed after the second step, the height from the bottom surface of the side wall portion 23 of oxide film to the upper end of the side wall portion 8-2 of the electric charge storage electrode becomes lower than the height from the bottom surface of the oxide film 20 to the upper end of the side wall portion 8-1 of the electric charge storage electrode.

When the third to fifth steps are repeated before executing the sixth step, the height of the side wall of oxide film adjacent to the outermost portion of the electric charge storage electrode eventually becomes equal to that of the upper end of the electric charge storage electrode and it becomes impossible to repeat the third to fifth steps.

However, when the seventh to ninth steps are executed after the second step, because of the distance from the bottom surface of the oxide film 20 to the upper end of the side wall portion 8-2 of the electric charge storage electrode, it becomes possible to execute the second, seventh and eighth steps repeatedly before the ninth step.

Figure 11:
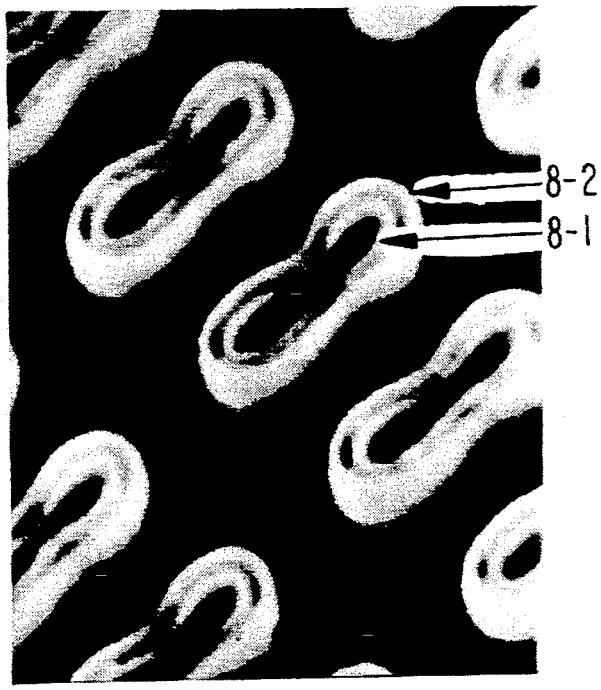
FIG. 11 is an SEM photograph showing the surface of an electric charge storage electrode.

FIG. 11 shows an SEM observation image of the electric charge storage electrode prepared by the present embodiment. The present embodiment uses a 0.4 μm rule process equivalent to a 64M DRAM. The pattern formation is carried out by an electron beam lithography method and an exicimer laser lithography method.

The cell has a size of 2.0×0.9 μm$^2$; and the electric charge storage electrode has a bottom portion having a size of 1.4×0.5 μm$^2$. The capacitor insulation film 25 is composed of a ONO film and is equivalent in capacitance to the oxide film of 7 n m.

Figure 12:
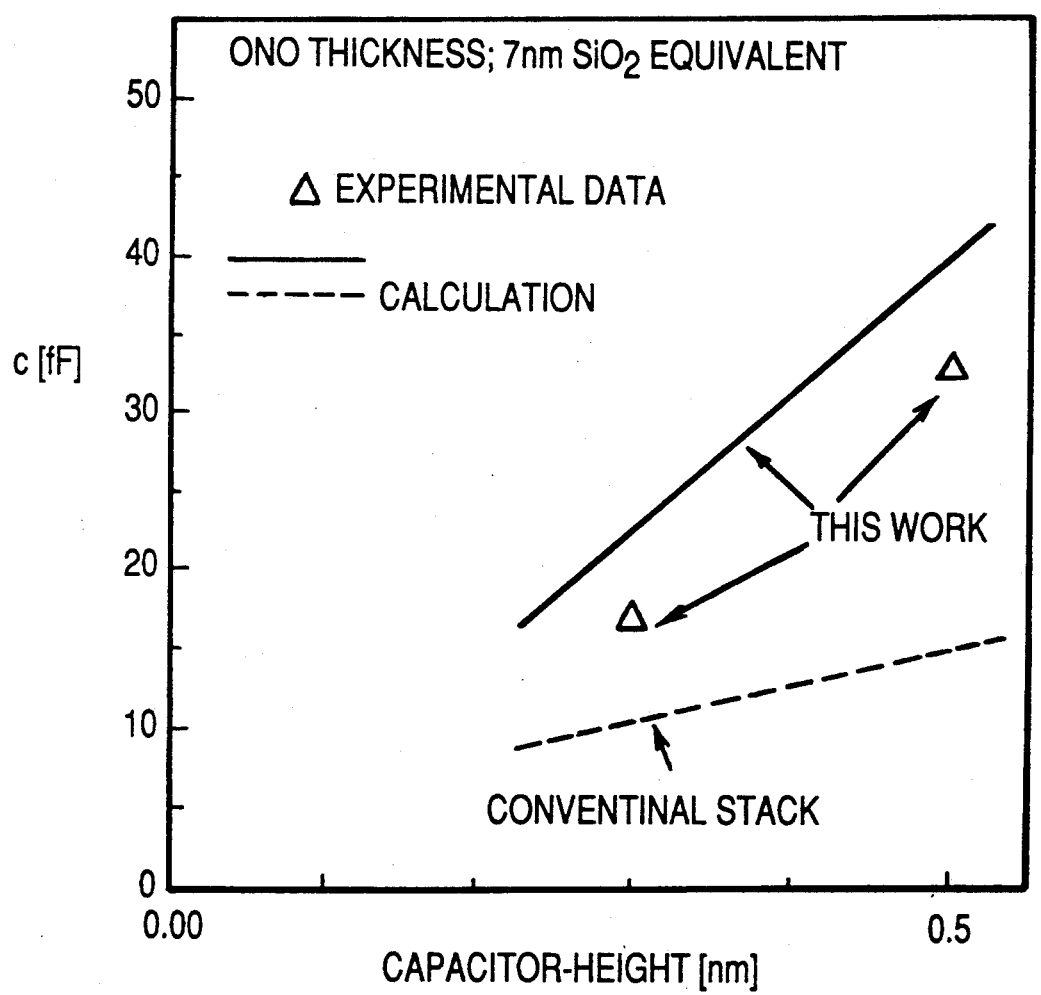
FIG. 12 is a graph showing a relationship between a capacitor height and a storage capacitance for experimental data and theoretical data in comparing an electric charge storage electrode according to the present invention with a prior art electric charge storage electrode.

FIG. 12 is a graph showing a relationship between a capacitor height and the capacitance amount in comparing the experimental value and the calculated value, in connection with the present embodiment of the device and a conventional device. The capacitor height H is defined as a distance from the upper end of the inter-layer insulation film 7 to the upper end of the plate electrode 10. It is noted that the present embodiment of the device has an electric charge capacitance sufficiently larger than that of the conventional device.

Figure 13:
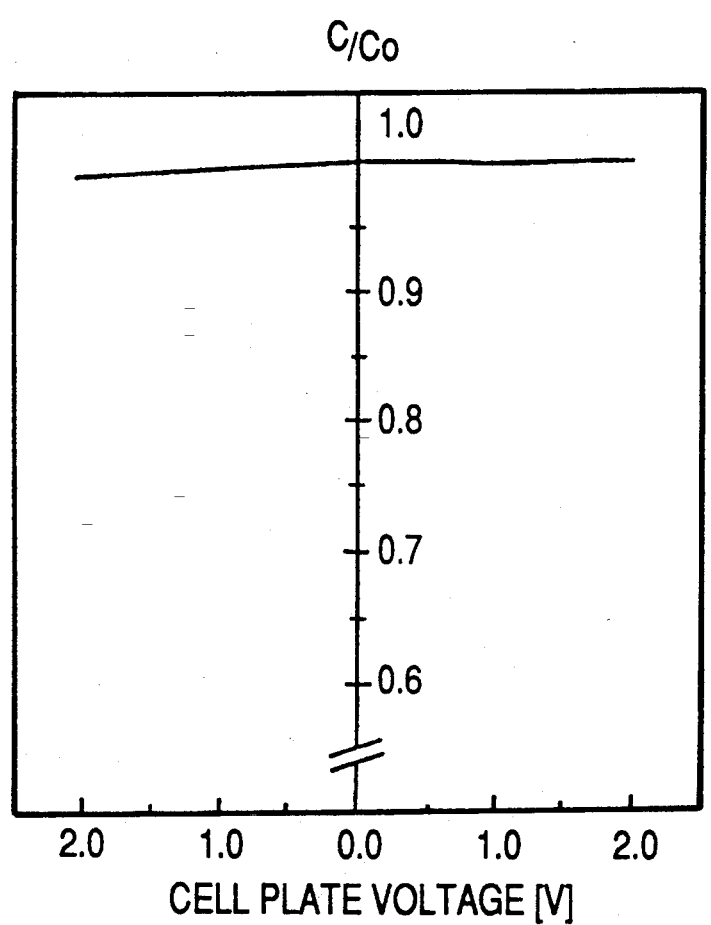
FIG. 13 is a graph showing experimental result for a relationship become a storage capacitance and a cell plate voltage of a memory cell according to the present invention.

FIG. 13 is a graph showing a voltage dependence of the electric charge capacitance C for the present embodiment of the device. The capacitor cell according to the present invention has a sufficiently stable voltage-capacitance relationship since the variation in the capacitance is within 5% at a voltage range of from −2 to +2 V. The capacitance C$_0$ is a value at a plate voltage of OV.

Second Preferred Embodiment

Figure 17A:
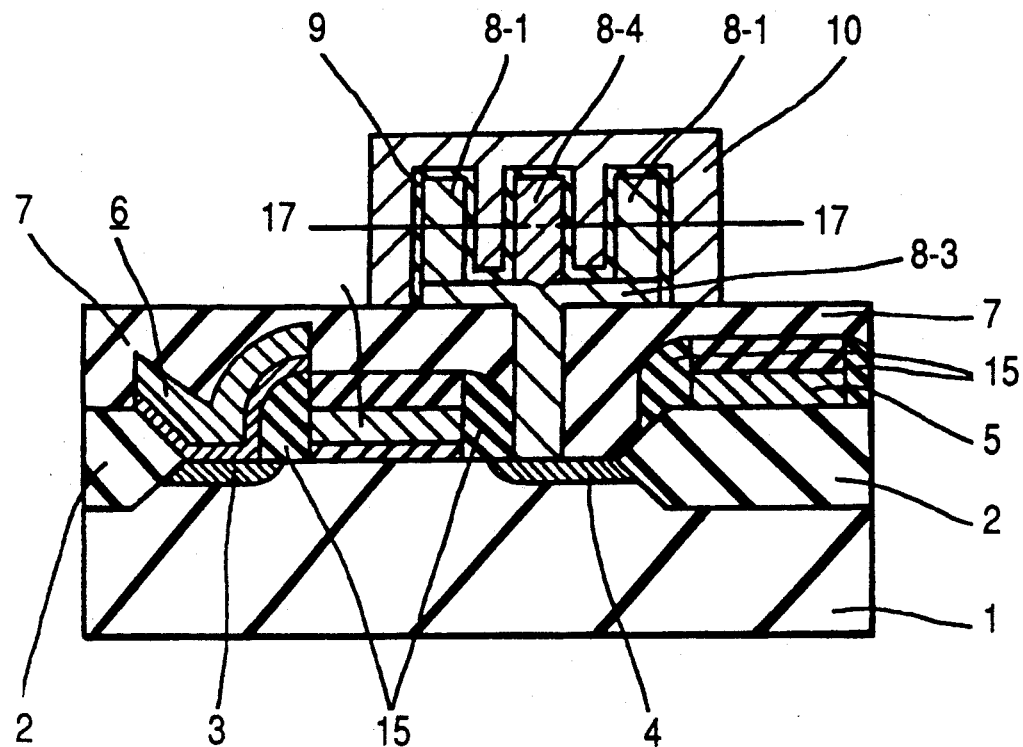
FIG. 17($a$) is a cross-sectional view of a memory cell of a semiconductor integration circuit according to a second preferred embodiment of the present invention.
Figure 17B:
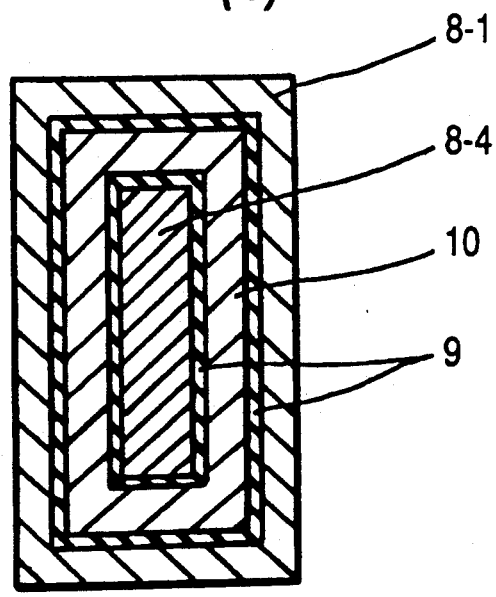

FIGS. 17(a) and 17(b) show a cross-sectional view of a memory cell of DRAM as a semiconductor integration circuit according to the second preferred embodiment of the present invention.

As shown in FIG. 17(a), a MOS transistor for the memory cell consists of a source region 3, a drain region 4, a gate oxide film 11a, and a gate electrode (or word line) 5 formed on a surface of a semiconductor substrate 1. The capacitor cell for the memory cell consists of charge storage electrodes 8-1, 8-3 and 8-4, a capacitor insulation film 9 and a plate electrode 10, and electric charge is stored in the charge storage electrodes 8-1, 8-3 and 8-4. A bit line 6 is formed by a composite film of a poly-Si film 16a and a field oxide film 17a of a refractory metal. Further, a reference numeral 2 indicates a field oxide film, 7 indicates an inter-layer insulation film, 13a indicates an upper insulation film and 15 indicates a side wall of an oxide film.

FIG. 17(b) is a cross-sectional view taken along line 17—17 of FIG. 17(a).

According to the structure shown in FIGS. 17(a) and 17(b), the charge storage electrode 8 includes at least one column-like portion and at least one frame-like portion surfaces of which are used for forming a capacitance and, therefore, has a capacitance layer with greater capacitance than that of a conventional stacked capacitor cell with a size equal to that of the latter.

Next, a manufacturing method of the stacked capacitor cell according to the second preferred embodiment will be explained.

Figure 18:
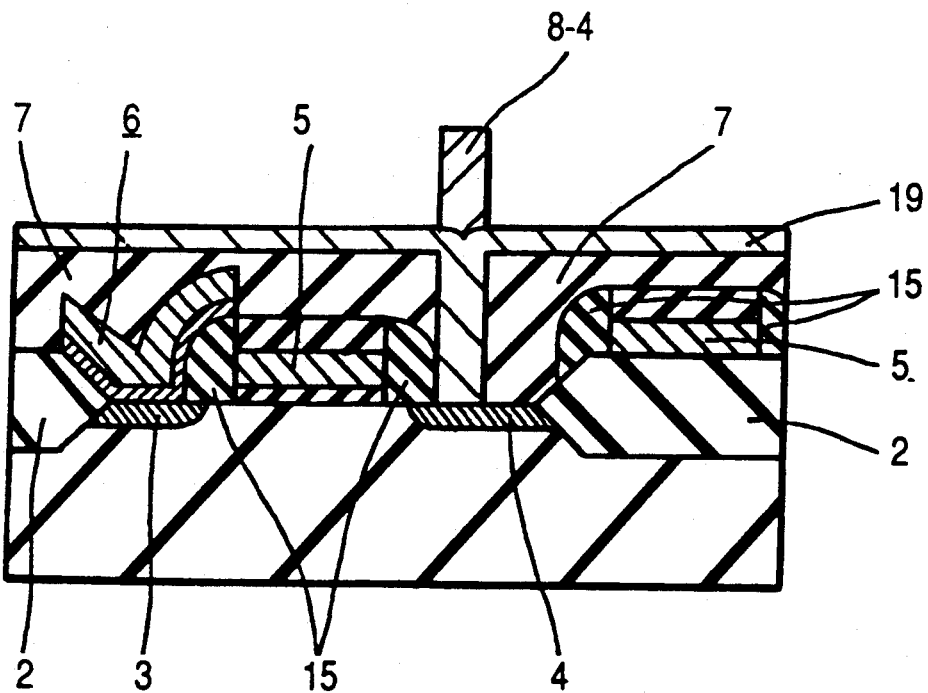
FIGS. 18, 19, 20 and 21 are cross-sectional views showing individual steps for manufacturing the semiconductor integration circuit shown in FIGS. 17($a$) and 17($b$) according to the present invention.

The steps up to the formation of the contact hole 18 shown in FIG. 6 are the same as those in the first preferred embodiment. The contact groove 18 is filled with a poly-Si film 19 containing P of several percent by depositing the same with a low temperature insertion CVD method. Then, after depositing a poly-Si film by a low temperature insertion CVD method, a column-like poly-Si portion 8-4 is formed in the cell area by a photolithographic method, as shown in FIG. 18. The column-like portion 8-4 has a single or a separated pattern.

Figure 19:
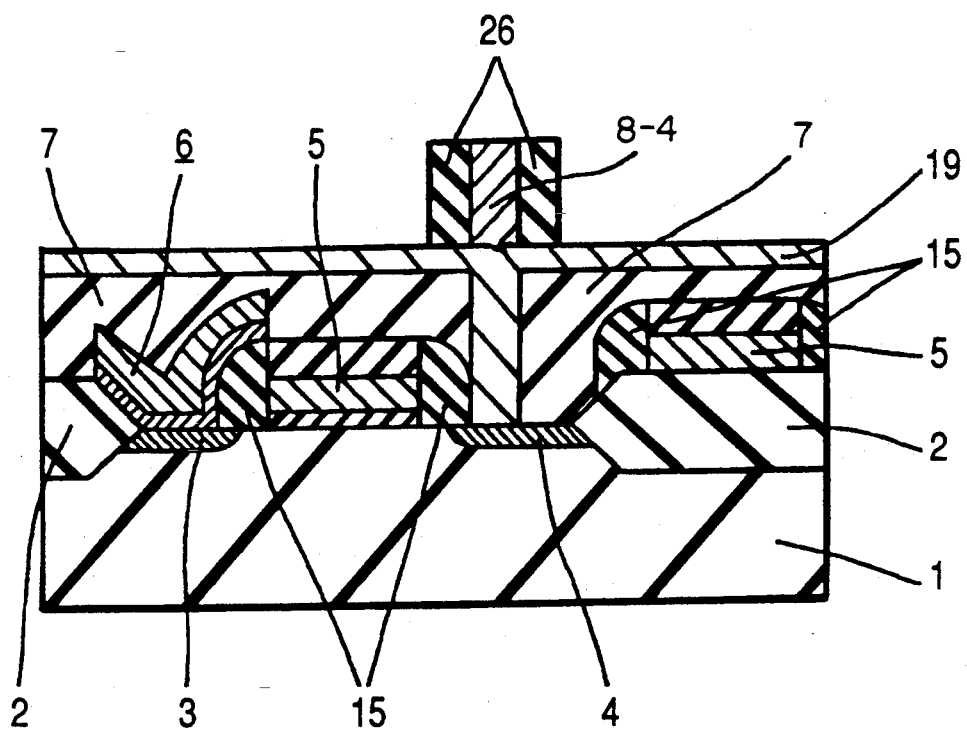
Figure 20:
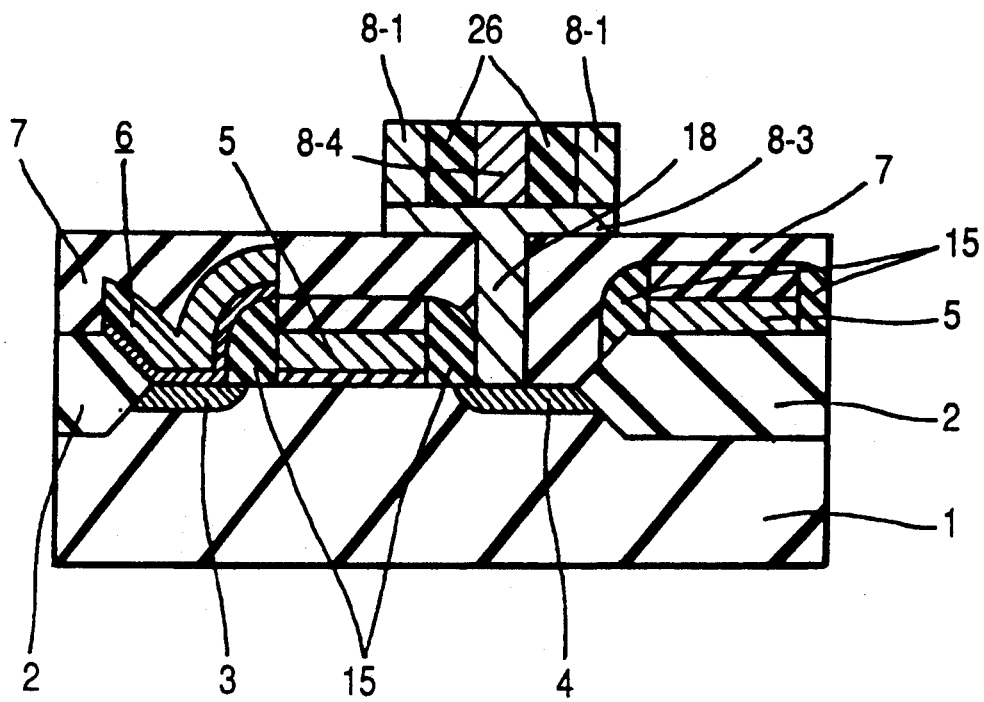

Then, after depositing a SiO$_2$ film by a CVD method, the SiO$_2$ film is etched anisotropically to form a side wall portion 26 of SiO$_2$ film, as shown in FIG. 19. Further, after depositing a poly-Si film containing P of several percent by a low temperature insertion CVD method, a side wall portion 8-1 surrounding the column-like portion 8-4 and a bottom portion 8-3 are formed as the charge storage electrode by an anisotropic etching, as shown in FIG. 20.

It is to be noted that multiple side wall portions 8-1 can be formed by repeating processes disclosed in the first preferred embodiment.

Thereafter, the side wall portion 26 of the oxide film is removed by a suitable method, for instance, a wet-etching. Further, a capacitance insulation film 9 and a plate electrode 10 are formed on the charge storage electrode 8 consisting of the poly-Si film portions 8-1, 8-3 and 8-4 and, thus, a stacked capacitor cell is formed.

Although poly-Si films are used for the first to third electrically conductive films and SiO$_2$ films are used for the first to third insulation films in the first and second preferred embodiments, conductive films made of a refractory metal such as W or a refractory silicide such as WSi$_2$ can be used for the first to third conductive films, and insulation films such as Si$_2$N$_4$ films can be used for the first to third insulation films. Further, conductive films other than those used for the first to third conductive films can be used for the first to third insulation films. For example, when poly-Si films are used for the first to third films, deposited films of a refractory metal such as W can be used for the first to third insulation films.

Third Preferred Embodiment

Figure 22A:
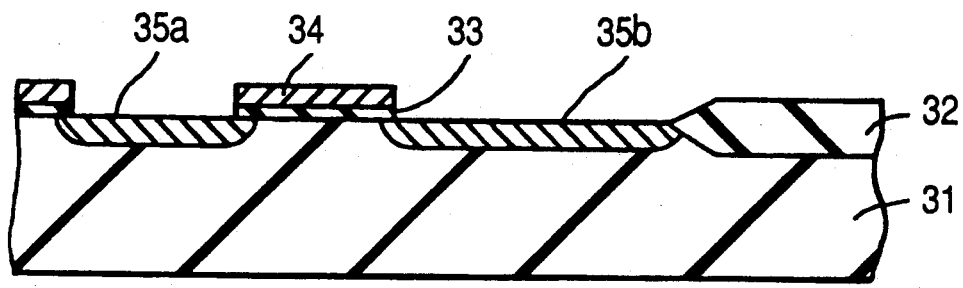
FIGS. 22($a$) to 22($e$) are cross-sectional views showing individual steps for manufacturing the semiconductor integration circuit according to a third preferred embodiment of the present invention.
Figure 22B:
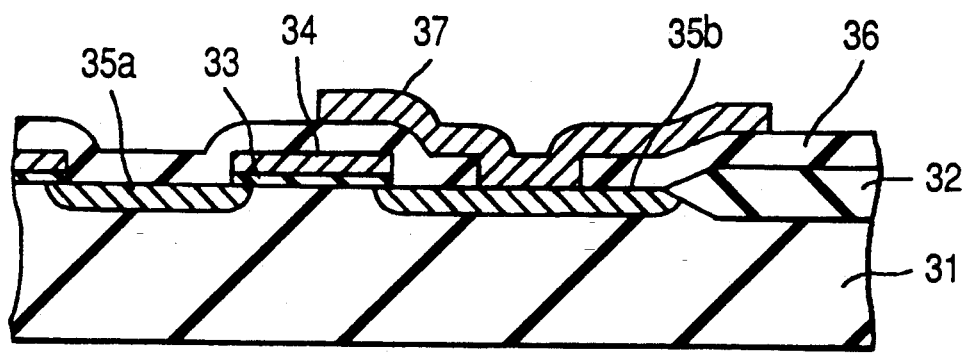
Figure 22C:
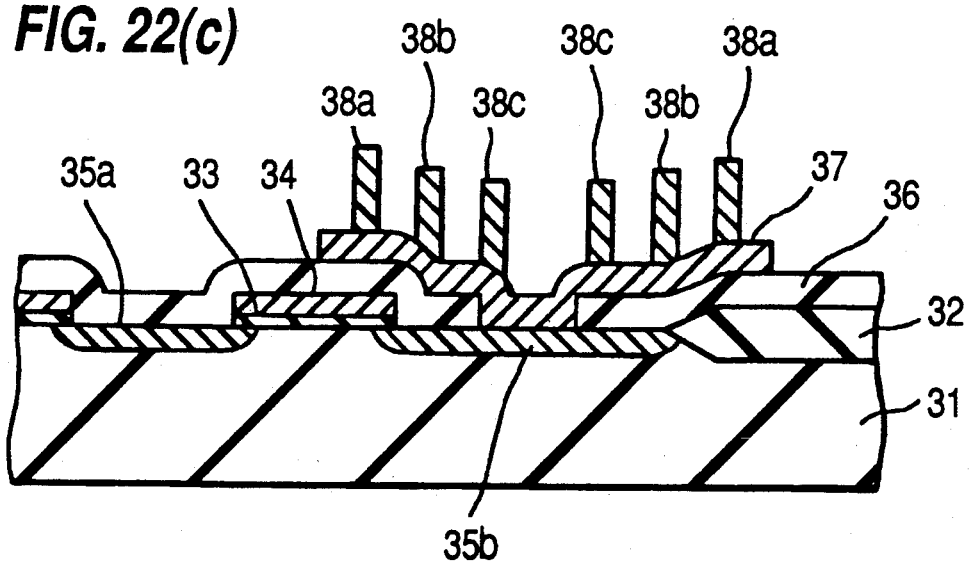
Figure 22D:
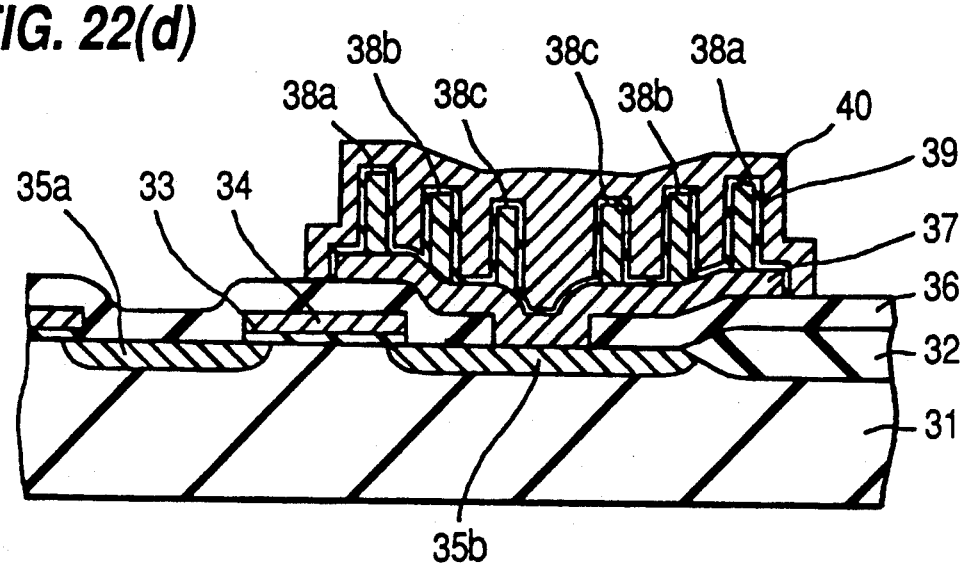
Figure 22E:
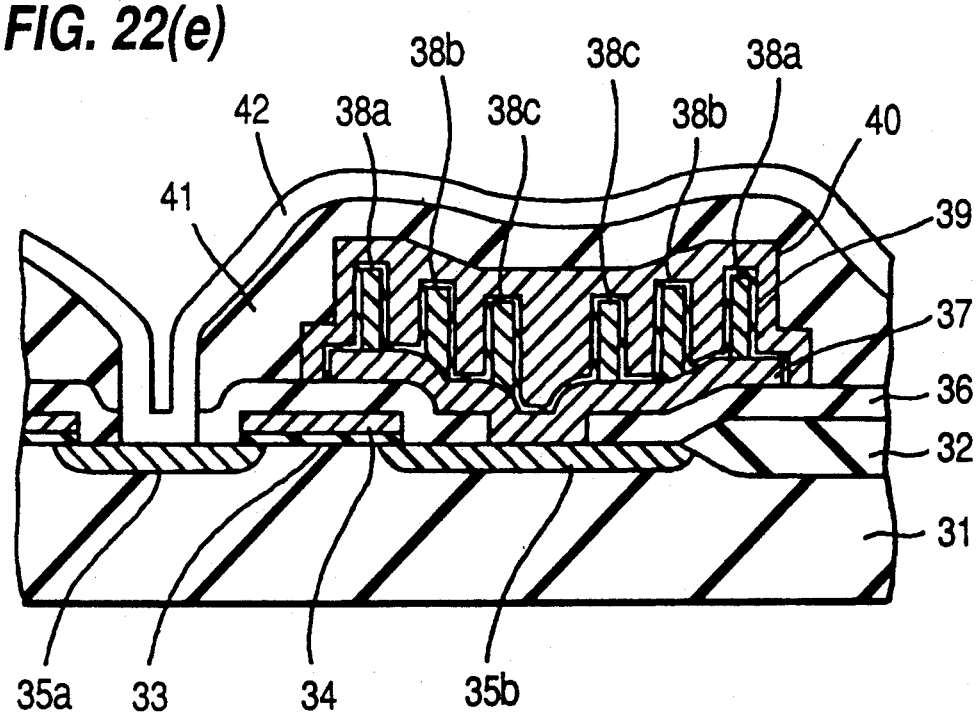

FIG. 22(e) shows a capacitance memory cell according to the third preferred embodiment of the present invention. The capacitance memory cell has an electric charge storage electrode 37 having column-like portions 38a, 38b and 38c as shown in FIGS. 22(c)-22(e).

These column-like portions 38a, 38b and 38c can be formed so as to have a width of 0.15 to 0.3 μm which is difficult to form by the photolithography technique. In order for that, a pattern is made using an electron beam exposure method or X-ray exposure method and is dry-etched using a reactive ion etching (RIE) method.

Each column-like portion is formed to have a height of 0.5 to 1.5 μm in order to obtain enough storage capacitance for electric charges.

FIGS. 22(a) to 22(e) show steps of a manufacturing method for the capacitance memory cells.

In FIG. 22(a), a reference numeral 31 denotes a semiconductor substrate of P-type (100), 32 denotes a separation oxide film of a thickness of 500 nm formed by a local oxidation of silicon (LOCOS) method, 33 denotes a gate oxide film of a thickness of 16 nm, and 34 denotes a poly-Si gate of a thickness of 250 nm forming a word line. Further, 35a and 35b denote high density n+ semiconductor regions and form source and drain, respectively.

The processes up to this step are the same as those of the conventional manufacturing method. It is desirable that the transistor have a lightly doped drain (LDD) structure though it is not shown in FIG. 22(a).

Thereafter, a CVD SiO$_2$ film 36 of a thickness of 250 nm is formed over the entire existing surface.

Before forming the CVD SiO$_2$ film 36, the surfaces of the high density n+ semiconductor regions 35a and 35b may be thermally oxidized to a thickness of about 10 nm. After perforating a portion of the CVD SiO$_2$ film 16 on the drain 35b, a poly-Si film 37 is formed to have a thickness of 200 to 300 nm. As is implanted in the poly-Si film 37 by an ion implanting method under conditions of 60 KeV and 6×10$^{15}$/cm$^2$. The poly-Si 37 may be made by n+ doped poly-Si.

Figure 21:
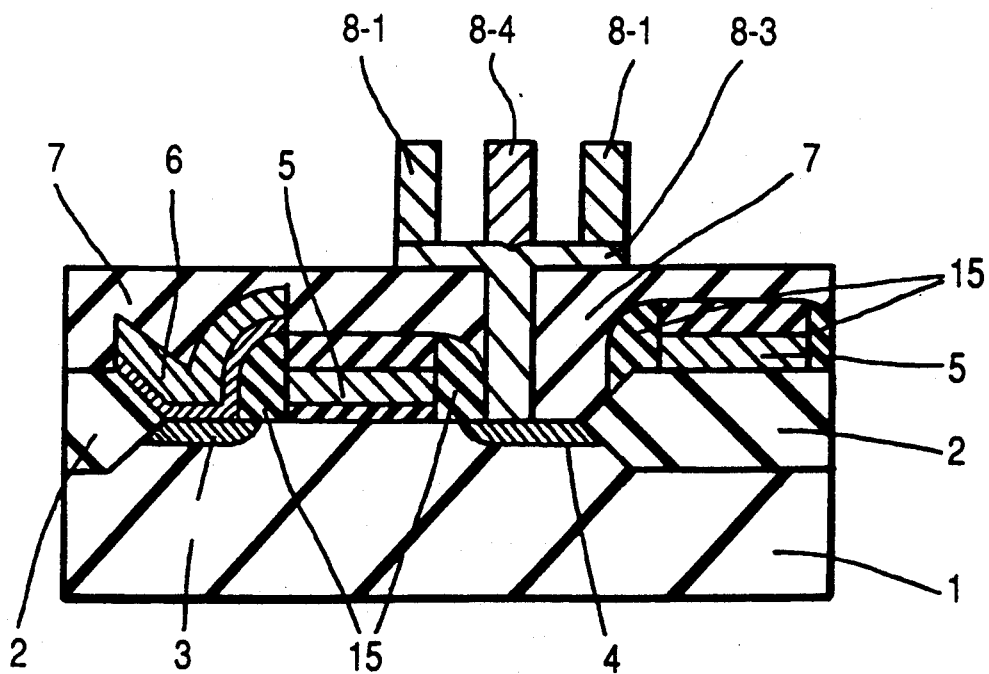

Then a mask pattern of a storage node is formed on the drain 35b using a photolithographic method, and the poly-Si film 37 is dry-etched using a mask of the photoresist film and, thereafter, the photoresist film is removed, as shown in FIG. 21(b).

In FIG. 22(c), an n+ doped poly-Si 38 of a thickness of 0.5 to 1.5 μm is formed on the poly-Si film 37.

This poli-Si film 38 may be formed by ion-implanting of a non-doped poly-Si film.

Figure 23:
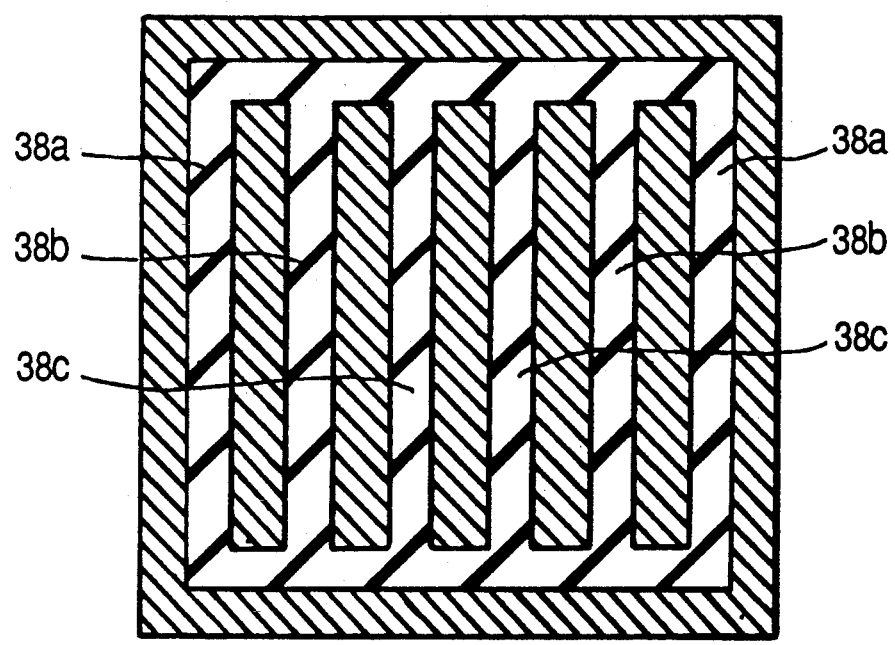
FIG. 23 is a plan view of an electric charge storage electrode according to the third preferred embodiment.
Figure 24:
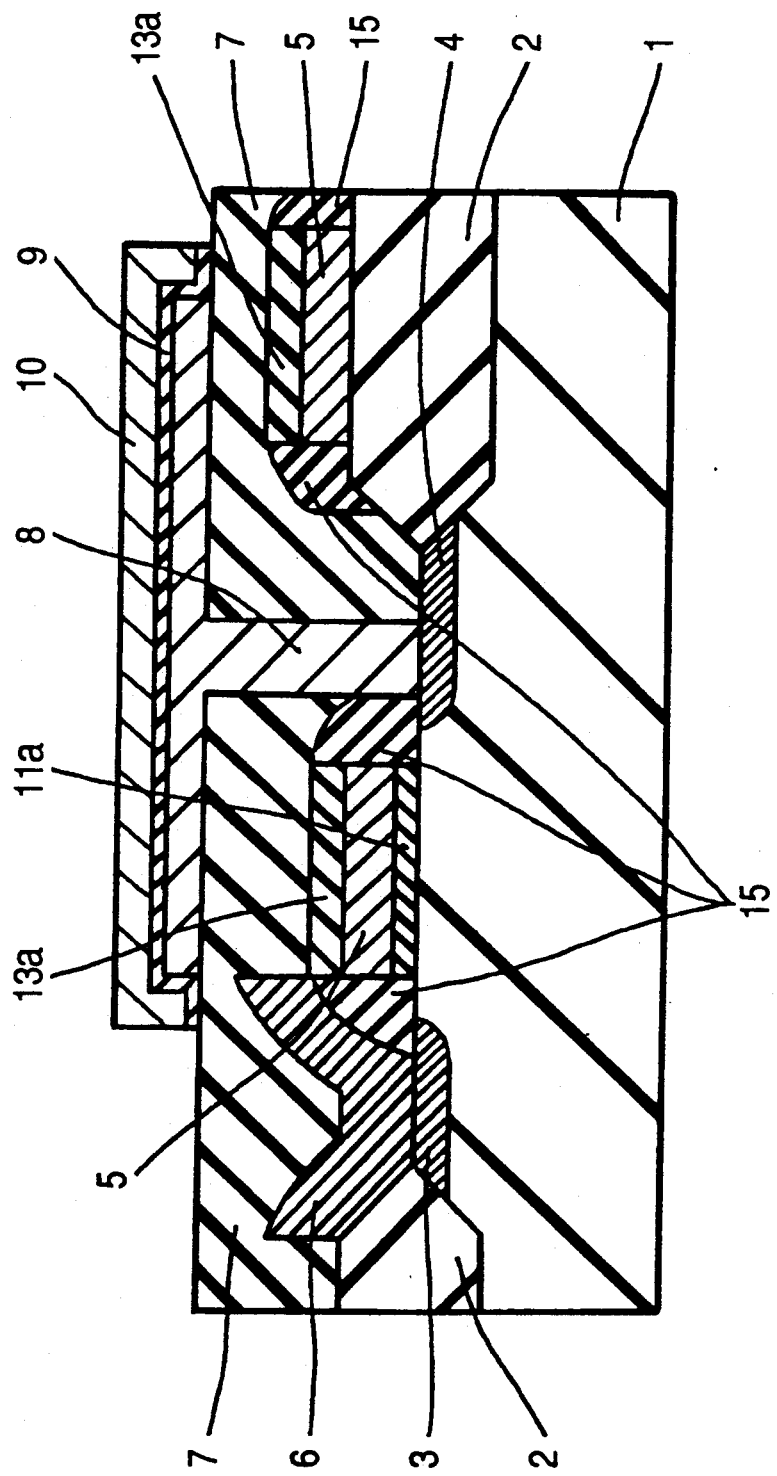
FIG. 24 is a cross-sectional view of a memory cell of a prior art semiconductor integration circuit.

Thereafter, a pattern of a photoresist film, as shown in FIG. 23, is formed on the poly-Si film 37 of the storage node so as to have a width of 0.15 to 0.3 μm by the electron beam exposure method of X-ray exposure method. The n+ doped poly-Si film 38 is dry-etched with a mask of the photoresist film by the RIE method and, thereby, column-like poly-Si portions 38a, 38b and 38c are formed. The whole surface are of the poly-Si forming an electric charge storage electrode can be increased while the width of the poly-Si pattern is formed small.

Thereafter, the surfaces of the poly-Si 37, 38a, 38b and 38c of the storage node are thermally oxidized to a thickness of 5 to 10 nm to form a capacitance insulation film 39. This capacitance insulation film 39 may be an SiO$_2$ single layer, SiO$_2$/Si$_3$N$_4$ composite film, SiO$_2$/Si$_3$N$_4$/SiO$_2$ composite film or the like.

Thereafter, an n+ doped poly-Si film 40 is formed on the capacitance insulation film 39 with a thickness of about 300 nm. Since the distance between adjacent column-like portions formed on the storage node 37 is 0.15 to 0.3 μm, gaps among column-like portions are buried by the n+ doped poly-Si film 40. The n+ doped poly-Si film 40 may be formed by ion-implanting of a non-doped poly-Si.

Thereafter, the poly-Si film 40 is dry-etched after patterning with a cell plate by the photolithographic method, as shown in FIG. 22(d).

Then, a CVD SiO$_2$ (BPSG) film 41 is formed with a thickness of 300 to 600 nm, as shown in FIG. 22(e) and it is reflowed by a thermal treatment to reduced height differences of the memory cell.

Before forming the CVD SiO$_2$ film 41, a CVD SiO$_2$ film containing no impurities is formed in a thickness of 100 nm though it is not represented in FIG. 22(e). After perforating a contact on the source 35a, a polyside bit line 42 is formed at a thickness of 300 nm. Thus, a DRAM cell is completed.

It is clear that the present invention achieves the following desirable effects. A stacked capacitance cell according to the present invention has at least double frame-like wall portions and/or at least one column-like portion rising upwardly from the bottom portion. The side wall portions and/or at least one column-like portion have surfaces functioning as a capacitor and, therefore, achieve a large capacitance amount larger than the conventional stacked capacitance cell in spite of having the same area between the two stacked capacitance cells. A stacked capacitance cell according to the present invention is very useful in practice.

A method for making a stacked capacitor cell according to the present invention can make it possible to self-align capacitors by repeating a deposition of an oxide film and a polycrystalline silicon film and an anisotropic etching.

Although the present invention has been fully described in connection with the preferred embodiments thereof with reference to the accompanying drawings, it is to be noted that various changes and modification are apparent to those skilled in the art. Such changes and modifications are to be understood as included with the scope of the present invention as defined by the appended claims unless they depart therefrom.

What is claimed is:

1. A manufacturing method for manufacturing a semiconductor integration circuit with stacked capacitor cells, comprising the steps of:
   forming an insulation film on a semiconductor substrate;
   making a contact hole in said insulation film which extends to the upper surface of said semiconductor substrate for each stacked capacitor cell;
   forming a first conductive film on said insulation film and the inner surface of said contact hole;
   forming a first deposited film on said first conductive film;
   working said first deposited film to provide it with a shape having side wall portions;
   forming a second conductive film on said side wall portions and the upper surface of said first deposited film and on the surface of said first conductive film uncovered by said first deposited film;
   forming a second deposited film over all existing outer surfaces, and etching said second deposited film anisotropically to remove said second deposited film except for portions thereof surrounding the side wall portions of said second conductive film;
   forming a third conductive film over all existing outer surfaces, and etching said second and third conductive films anisotropically to remove portions thereof other than the portions thereof surrounding the side wall portions of said first and second deposited films, to thereby form an electric charge storage electrode;
   removing said first and second deposited films;
   forming a capacitance deposited film on said electric charge storage electrode; and
   forming a plate electrode on said capacitance deposited film.

2. The manufacturing method for manufacturing a semiconductor integration circuit as claimed in claim 1, wherein
   said first to third conductive films are poly-Si films and said first and second deposited films are oxide films.

3. A manufacturing method for manufacturing a semiconductor integration circuit with stacked capacitor cells, comprising the steps of:
   forming an insulation film on a semiconductor substrate;
   making a contact hole in said insulation film for each stacked capacitor cell;
   forming a first conductive film on said insulation film and the inner surface of said contact hole;
   forming a first deposited film on said first conductive film;
   working said first deposited film to form a configuration having side wall portions;
   forming a second conductive film over all existing outer surfaces;
   etching said second conductive film anisotropically to remove all but the portions thereof surrounding said side wall portions;
   forming a second deposited film over all existing outer surfaces;
   etching said second deposited film anisotropically to remove all but portions thereof surrounding the side wall portions of said second conductive film;
   forming a third conductive film over all existing outer surfaces;
   etching said third conductive film anisotropically to remove all but portions thereof surrounding said side wall portions of said second deposited film, to thereby form an electric charge storage electrode;
   removing said first and second deposited films;
   forming a capacitance deposited film on said electric charge storage electrode; and
   forming a plate electrode on said capacitance deposited film.

4. The manufacturing method for manufacturing a semiconductor integration circuit as claimed in claim 3, wherein:
   said first to third conductive films are poly-Si films and said first and second deposited films are oxide films.

5. A manufacturing method for manufacturing a semiconductor integration circuit with stacked capacitor cells, comprising the steps of:
   forming an insulation film on a semiconductor substrate;
   making a contact hole in said insulation film which extends to the upper surface of said semiconductor substrate for each stacked capacitor cell;
   forming a first conductive film on said insulation film and the inner surface of said contact hole;
   forming a second conductive film on said first conductive film;
   working said second conductive film to form at least one column-like member;
   forming a first deposited film over all existing outer surfaces, and etching said first deposited film anisotropically to remove all but portion thereof surrounding side walls of said at least one column-like member;
   forming a third conductive film over all existing outer surfaces, and etching said third conductive film anisotropically to remove all but portion thereof surrounding side walls of said first deposited film to form an electric charge storage electrode;
   removing said first deposited film;
   forming a capacitance deposited film on said electric charge storage electrode; and
   forming a plate electrode on said capacitance deposited film.

6. The manufacturing method for manufacturing a semiconductor integration circuit as claimed in claim 5, wherein
   in forming said first conductive film, said contact hole is filled by said first conductive film; and
   in forming said at least one column-like member by working said second conductive film, said at least one column-like member is formed so as to be supported on said first conductive film at a level above an upper surface of said first insulation film.

7. The manufacturing method for manufacturing a semiconductor integration circuit as claimed in claim 5, wherein said first to third conductive films are poly-Si films and said first deposited film is an oxide film.

8. A manufacturing method for manufacturing a semiconductor integration circuit with stacked capacitor cells, comprising the steps of:

forming a first insulation film on a semiconductor substrate;

making a contact hole in said first insulation film for each stacked capacitor cell;

forming a first conductive film on said first insulation film and an inner surface of said contact hole;

forming a second insulation film on said first conductive film;

working said second insulation film to form a configuration having side wall portions;

forming a second conductive film on existing outer surfaces of said second insulation film and said first conductive film;

forming a third insulation film over all existing outer surfaces;

etching said third insulation film anisotropically to remove all but the portions thereof surrounding the side wall portions of said second conductive film;

forming a third conductive film over all existing outer surfaces;

etching said third and second conductive films anisotropically so as to make them remain only around sidewall portions of said third insulation film and side wall portions of said second insulation film, respectively, to thereby form an electric charge storage electrode;

removing said second and third insulation films;

forming a capacitance insulation film; and forming a plate electrode on said capacitance insulation film.

9. A manufacturing method for manufacturing a semiconductor integration circuit with stacked capacitor cells, comprising the steps of:

forming a first insulation film on a semiconductor substrate;

making a contact hole in said first insulation film for each stacked capacitor cell;

forming a first conductive film on said first insulative film and the inner surface of said contact hole;

forming a second insulation film on said first conductive film;

etching said second insulation film anisotropically to form a configuration having side wall portions;

forming a second conductive film over all existing outer surfaces of said second insulation film and said first conductive film;

etching said second conductive film to make it remain only around the side wall portions of said second insulation film;

forming a third insulation film over all existing outer surfaces;

etching said third insulation film anisotropically to make it remain only around the side wall portions of said second conductive film;

forming a third conductive film over all existing outer surfaces;

etching said third conductive film anisotropically to make said third conductive film and said second conductive film remain only around the said wall portions of said third insulation film and side wall portions of said second insulation film, respectively, to thereby form an electric charge storage electrode;

removing said second and third insulation films;

forming a capacitance insulation film on said electric charge insulation film; and forming a plate electrode on said capacitance insulation film.

10. A manufacturing method for manufacturing a semiconductor integration circuit with stacked capacitor cells, comprising the steps of:

forming a first insulation film on a semiconductor substrate;

making a contact hole in said first insulation film for each stacked capacitor cell;

forming a first conductive film on said first insulation film and the inner surface of said contact hole;

forming a second conductive film on said first conductive film;

working said second conductive film to form at least on column-like portion;

forming a second insulation film over all existing outer surfaces;

etching said second insulation film anisotropically to make it remain only around the side wall portions of said at least one column-like portion;

forming a third conductive film over all existing outer surfaces;

etching said third conductive film anisotropically to make said second and third conductive films remain only around side wall portion of said second insulation film, respectively, to thereby form an electric charge storage electrode;

removing said second insulation film;

forming a capacitance insulation film on said electric charge storage electrode; and forming a plate electrode on said capacitance insulation film.

11. The manufacturing method for manufacturing a semiconductor integration circuit as claimed in claim 10, wherein in forming said first conductive film, said contact hole is filled by said first conductive film; and in forming said at least one column-like member by working said second conductive film, said at least one column-like member is formed so as to be supported on said first conductive film at a level above an upper surface of said first insulation film.

* * * * *